United States Patent
Tanaka

(10) Patent No.: US 9,804,503 B2
(45) Date of Patent: Oct. 31, 2017

(54) RESIST PLACING METHOD AND RESIST PLACING PROGRAM

(71) Applicant: KABUSHIKI KAISHA TOSHIBA, Minato-ku, Tokyo (JP)

(72) Inventor: Satoshi Tanaka, Kawasaki (JP)

(73) Assignee: Toshiba Memory Corporation, Tokyo (JP)

( * ) Notice: Subject to any disclaimer, the term of this patent is extended or adjusted under 35 U.S.C. 154(b) by 429 days.

(21) Appl. No.: 14/305,320

(22) Filed: Jun. 16, 2014

(65) Prior Publication Data

US 2015/0234287 A1    Aug. 20, 2015

(30) Foreign Application Priority Data

Feb. 17, 2014 (JP) .................. 2014-027866

(51) Int. Cl.
| | | |
|---|---|---|
| *G03B 27/02* | (2006.01) | |
| *G03F 7/20* | (2006.01) | |
| *G03F 7/00* | (2006.01) | |

(52) U.S. Cl.
CPC .......... *G03F 7/7035* (2013.01); *G03F 7/0002* (2013.01)

(58) Field of Classification Search
CPC ........ G03F 7/0002; G03F 7/20; G03F 7/7042; G03F 7/708; G03F 7/709; G03F 7/7035; B29C 2043/142; B29C 43/021; B29C 43/04; B29C 43/14; B82Y 10/00; B82Y 40/00; H01L 29/78621
USPC ....... 355/27, 53, 72, 74, 78, 85, 87, 95, 112, 355/122, 132; 347/9; 430/5, 269, 310, 430/320, 322, 325, 326, 396; 216/27, 40, 216/44, 48, 49, 52, 57; 118/669, 679, 56
See application file for complete search history.

(56) References Cited

U.S. PATENT DOCUMENTS

| | | | |
|---|---|---|---|
| 5,126,754 A * | 6/1992 | Spinar .................... | G01D 15/18 346/139 R |
| 7,523,701 B2 | 4/2009 | Loopstra et al. | |
| 8,119,052 B2 | 2/2012 | Schumaker | |
| 8,392,855 B2 | 3/2013 | Morinaga et al. | |
| 8,560,977 B2 | 10/2013 | Matsuoka et al. | |
| 9,201,990 B2 | 12/2015 | Wakamatsu et al. | |
| 2007/0228593 A1* | 10/2007 | Jones .................... | B29C 43/003 264/40.4 |
| 2012/0028378 A1 | 2/2012 | Morinaga et al. | |

(Continued)

FOREIGN PATENT DOCUMENTS

| | | |
|---|---|---|
| JP | 2000-194142 | 7/2000 |
| JP | 2011-228619 A | 11/2011 |

(Continued)

*Primary Examiner* — Christina Riddle
(74) *Attorney, Agent, or Firm* — Finnegan, Henderson, Farabow, Garrett & Dunner, L.L.P.

(57) ABSTRACT

According to one embodiment, a resist placing method sets first and second grating vectors of a drop grating on which to place a resist drop. At this time, the first and second grating vectors are set based on information about a grid, which is a minimum grating unit for which the resist drop can be dropped, such that the thickness of a resist film after imprinting is within a predetermined range. In this case, the first and second grating vectors are set to be in directions different from both first and second minimum grating vectors of the grid. Then, the resist drop is placed in the drop grating.

8 Claims, 14 Drawing Sheets

(56) References Cited

U.S. PATENT DOCUMENTS

2012/0074605 A1* 3/2012 Nakagawa et al. ....... G03F 7/16
                                                    264/40.1
2013/0020281 A1  1/2013  Wakamatsu et al.
2013/0249981 A1  9/2013  Nakagawa et al.
2014/0131313 A1  5/2014  Wakamatsu et al.

FOREIGN PATENT DOCUMENTS

| JP | 2012-033769 A | 2/2012 |
| JP | 2012-114157   | 6/2012 |
| JP | 2012-212833 A | 11/2012 |
| JP | 2013-201278   | 10/2013 |

* cited by examiner

FIG.7

RLT [nm]

| | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| 1 | 1175 | 573 | 372 | 271 | 211 | 171 | 142 | 121 | 104 | 91 | 80 | 70 | 63 | 56 | 50 |
| 2 | 573 | 271 | 171 | 121 | 91 | 70 | 56 | 45 | 37 | 30 | 25 | 20 | 16 | 13 | 10 |
| 3 | 372 | 171 | 104 | 70 | 50 | 37 | 27 | 20 | 15 | 10 | 7 | 3 | 1 | -1 | -3 |
| 4 | 271 | 121 | 70 | 45 | 30 | 20 | 13 | 8 | 3 | 0 | -3 | -5 | -7 | -8 | -10 |
| 5 | 211 | 91 | 50 | 30 | 18 | 10 | 4 | 0 | -3 | -6 | -8 | -10 | -11 | -13 | -14 |
| 6 | 171 | 70 | 37 | 20 | 10 | 3 | -1 | -5 | -8 | -10 | -12 | -13 | -15 | -16 | -17 |
| 7 | 142 | 56 | 27 | 13 | 4 | -1 | -5 | -8 | -11 | -13 | -14 | -16 | -17 | -18 | -19 |
| 8 | 121 | 45 | 20 | 8 | 0 | -5 | -8 | -11 | -13 | -15 | -16 | -17 | -18 | -19 | -20 |
| 9 | 104 | 37 | 15 | 3 | -3 | -8 | -11 | -13 | -15 | -17 | -18 | -19 | -20 | -20 | -21 |
| 10 | 91 | 30 | 10 | 0 | -6 | -10 | -13 | -15 | -17 | -18 | -19 | -20 | -21 | -21 | -22 |

Grid_X

Grid_Y

FIG.11

| A0 | | B0 | | RLT |
|---|---|---|---|---|
| ax | ay | bx | by | |
| 9 | 0 | 0 | 3 | 14.6 |
| 9 | 0 | 1 | 3 | 14.6 |
| 9 | 1 | -5 | 3 | 7.7 |
| 9 | 1 | -4 | 3 | 8.9 |
| 9 | 1 | -3 | 3 | 10.2 |
| 9 | 1 | -2 | 3 | 11.6 |
| 9 | 1 | -1 | 3 | 13.0 |
| 9 | 1 | 0 | 3 | 14.6 |
| 9 | 1 | 1 | 3 | 16.4 |
| 9 | 1 | 2 | 3 | 18.2 |
| 9 | 1 | 3 | 3 | 20.2 |
| 9 | 1 | 4 | 3 | 22.4 |
| 9 | 1 | 5 | 3 | 24.8 |
| 10 | 0 | 0 | 3 | 10.2 |
| 10 | 0 | 1 | 3 | 10.2 |
| 10 | 1 | -5 | 3 | 4.4 |
| 10 | 1 | -4 | 3 | 5.5 |
| 10 | 1 | -3 | 3 | 6.5 |
| 10 | 1 | -2 | 3 | 7.7 |
| 10 | 1 | -1 | 3 | 8.9 |
| 10 | 1 | 0 | 3 | 10.2 |
| 10 | 1 | 1 | 3 | 11.6 |
| 10 | 1 | 2 | 3 | 13.0 |
| 10 | 1 | 3 | 3 | 14.6 |
| 10 | 1 | 4 | 3 | 16.4 |
| 10 | 1 | 5 | 3 | 18.2 |

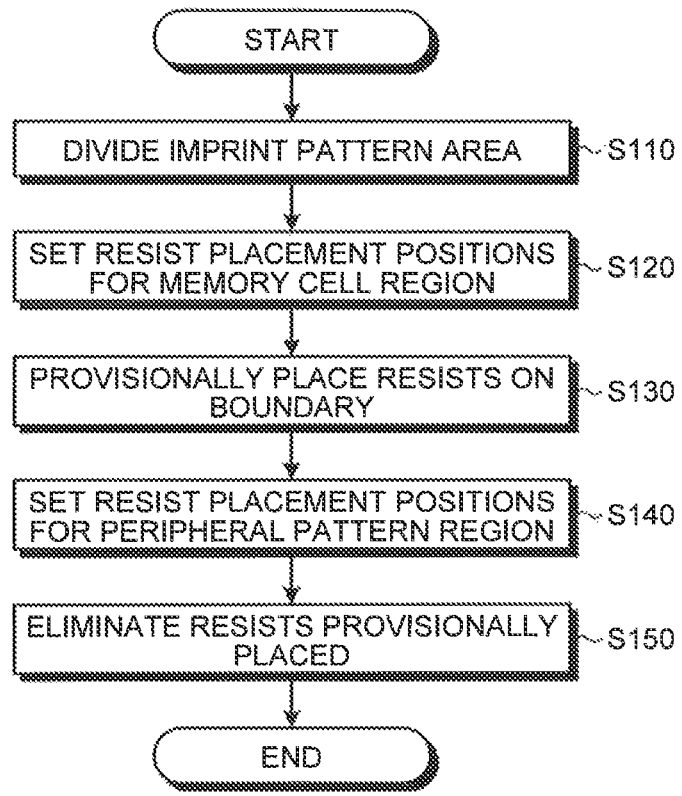
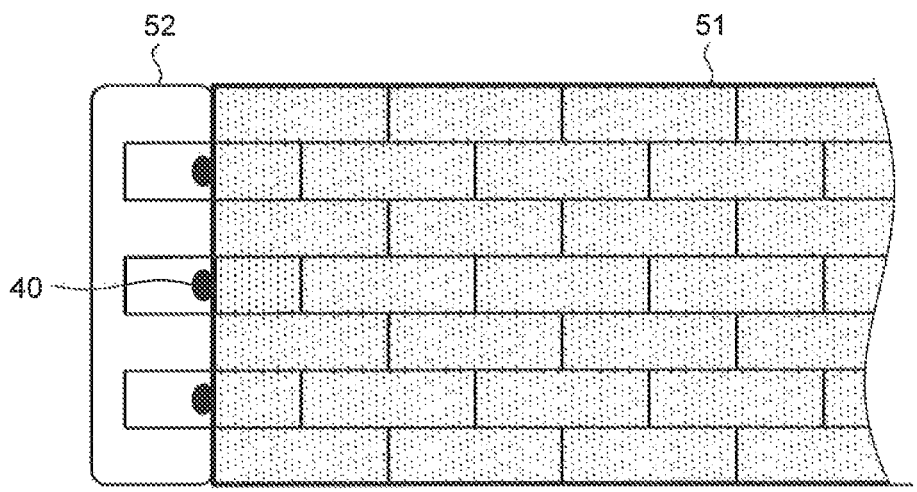

RESIST PLACING METHOD AND RESIST PLACING PROGRAM

CROSS-REFERENCE TO RELATED APPLICATIONS

This application is based upon and claims the benefit of priority from Japanese Patent Application No, 2014-027866, filed on Feb. 17, 2014; the entire contents of which are incorporated herein by reference.

FIELD

Embodiments described herein relate generally to a resist placing method and a resist placing program.

BACKGROUND

As semiconductor integrated circuits become finer, photolithography apparatuses that are pattern transfer apparatuses are required to have higher accuracy, and hence there is the disadvantage that the cost of the apparatus increases. Accordingly, as a technology for executing the formation of fine patterns at low cost, an imprint method has been proposed.

In this imprint method, a stamper (template) having recesses/protrusions in the same pattern, as a pattern to be formed on a substrate subject to transfer is pressed onto a resist (photo-curing organic material layer) on the surface of the substrate subject to transfer. By irradiating light onto the template pressed onto the resist, the resist is cured, and the template is separated (mold-removed) from the resist, and thereby its pattern is transferred into a resist pattern.

Resist used in the imprint method is dropped onto the substrate subject to transfer by, e.g., an ink jet method. In this case, in forming a fine periodic structure such as memory cells, resist is dropped onto predetermined positions on the substrate subject to transfer taking into account the anisotropy of surface tension due to the periodic structure. The resist is improved in filling speed by being placed on a periodic grating such as a checkered periodic grating.

However, when resist is placed on a periodic grating, the controllability for the pattern coverage rate a ad resist height is discrete, and thus it is difficult to obtain a desired RLT (Residual Layer Thickness). If an RLT greatly deviating from a desired value is used, the problem occurs that the shape accuracy of the transferred pattern becomes low. Accordingly, it is desired to perform resist placement which can form transferred patterns of high shape accuracy by imprint.

BRIEF DESCRIPTION OF THE DRAWINGS

FIG. 7 is a diagram showing the relation between the placement position of a resist and the RLT;

FIG. 11 is a diagram showing the results of calculating RLTs for set grating vectors;

FIG. 14 is a flow chart showing the procedure of creating the drop position information in the second embodiment;

FIG. 15 is a diagram for explaining the process of dividing an imprint pattern area;

DETAILED DESCRIPTION

According to one embodiment, there is provided a resist placing method. The resist placing method sets first and second grating vectors of a drop grating on which to place a resist drop. At this time, the first and second grating vectors are set based on information about a grid, which is a minimum grating unit for which the resist drop can be dropped onto a substrate. The first and second grating vectors are set such that the thickness of a resist film remaining between a template and the substrate after imprinting is within a predetermined range. In this case, the first and second grating vectors are set to be in directions different from both first and second minimum grating vectors of the grid. Then, the resist drop is placed in the drop grating formed of the set first and second grating vectors.

The resist placing methods and resist placing programs according to embodiments will be described in detail below with reference to the accompanying drawings. The present invention is not limited to these embodiments.

First Embodiment

Figure 1:
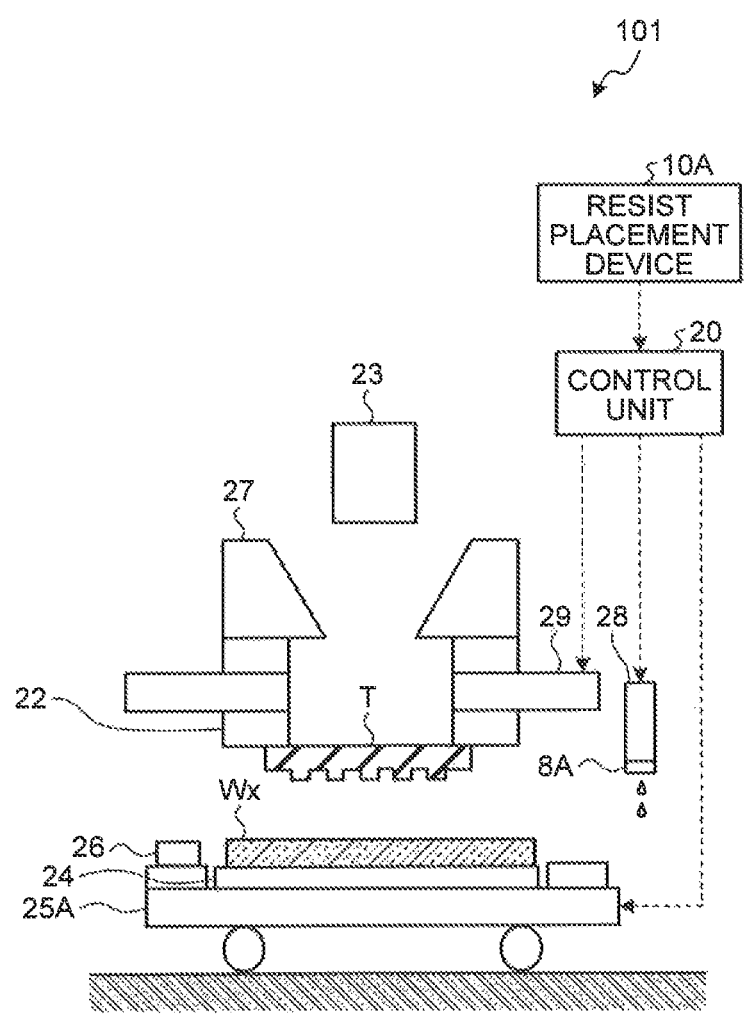
FIG. 1 is a diagram showing the configuration of an imprint apparatus according to a first embodiment.

FIG. 1 is a diagram showing the configuration of an imprint apparatus according to the first embodiment. The imprint apparatus 101 is an apparatus which transfers the template pattern (such as a circuit pattern) of a template (stamper) T, a mold substrate, onto a substrate (substrate subject to transfer) such as a wafer Wx.

The imprint apparatus 101 of the present embodiment places (drops) a resist drop (hereinafter called a resist) onto a position from which to be filled into the template T at high speed with the transferred pattern being high in shape accuracy.

The imprint apparatus 101 of the present embodiment comprises a resist placement device 10A and a control unit 20. Further, the imprint apparatus 101 comprises a master stage 22, a UV light source 23, a substrate chuck 24, a sample stage 25A, a reference mark 26, an alignment sensor 27, a liquid dropping device (drop dropping mechanism) 28, and a stage base 29.

The sample stage 25A has a wafer Wx mounted thereon and moves in a plane (horizontal plane) parallel to the wafer Wx mounted. The sample stage 25A moves the wafer Wx underneath the liquid dropping device 28 when being to drop a resist as transfer material onto the wafer Wx and moves the wafer Wx underneath the template T when being to perform a press process on the wafer Wx.

The substrate chuck 24 is provided on the sample stage 25A. The substrate chuck 24 fixes the wafer Wx at a predetermined position on the sample stage 25A. Further, the reference mark 26 is provided on the sample stage 25A. The reference mark 26 is a mark for detecting the position of the sample stage 25A and is used for alignment when loading the wafer Wx onto the sample stage 25A.

The master stage 22 is provided on the bottom side (the wafer Wx side) of the stage base 29. The master stage 22 has the template T fixed thereto at a predetermined position by vacuum suction or the like from the bottom side (opposite side to the template pattern) of the template T.

The stage base 29 supports the template T via the master stage 22 and presses the template pattern side of the template T into a resist on the wafer Wx. The stage base 29 moves in vertical directions, thereby pressing the template T into a resist and separating (mold-removing) doe template T from the resist. The resist used for imprinting is, for example, a resin (organic material) such as a photo-caring resin. Further, the alignment sensor 27 is provided on the stage base 23. The alignment sensor 27 is a sensor for performing the position detection of the wafer Wx and the position detection of the template T.

The liquid dropping device 28 is a device that drops a resist onto the wafer Wx by an ink jet method. An ink jet head 8A provided for the liquid dropping device 28 has multiple fine holes (ejection outlets) through which to eject droplets of resist. The liquid dropping device 26 controls the positions onto which droplets fail according to the pattern area of the template pattern formed in the template T.

The liquid dropping device 28 is configured to be able to drop resists at predetermined intervals (of a grid size) onto the wafer Wx by being moved at a predetermined speed relative to the wafer Wx. The grids are arranged at predetermined intervals along an X direction and Y direction described later, and the liquid dropping device 28 drops a resist onto a vertex position on the grid. In other words, the grid is a minimum grating unit for which the liquid dropping device 28 can drop a resist. The liquid dropping device 28 drops resists onto vertexes of the grids at a predetermined period so that the placement positions of resists are arranged regularly. In the description below, a grating piece formed or positions (grid vertexes) onto which to be able to drop a resist is referred to as a grid, and a grating piece formed of actually set drop positions is referred to as a drop grating.

The UV light source 23 is a light scarce emitting UV light and is provided above the stage base 29. The UV light scarce 23 irradiates UV light from above the template T with the template T being pressed into a resist.

The control unit 20 controls various constituents in the imprint, apparatus 101 such as the liquid dropping device 28 and the stage base 29. The control unit 20 controls the liquid dropping device 28 based on the resist placement positions set by the resist placement device 10A.

Here, the procedure of the imprint process will be described. When being to imprint onto the wafer Wx, the wafer Wx mounted on the sample stage 25A is moved under the liquid dropping device 28. Then, when being over a predetermined shot position on the wafer Wx, a resist is dropped. At this time, the liquid dropping device 23 drops the resist onto a resist placement position set by the resist placement device 10A.

Subsequently, the wafer Wx on the sample stage 25A is moved under the template T. Then, the template T is pressed into the resist on the wafer Wx. When the template T, made by cutting a pattern into a quartz substrate or the like, is pressed into the resist, the resist flows into the template pattern of the template T by a capillary phenomenon.

By the template T being pressed into the resist on the wafer Wx for a preset time, spreading on the water Wx, the resist is filled into the template pattern. The UV light source 23 irradiates UV light onto the resist in this state so as to be cured. Then, by mold-removing the template T from the cured resist, a resist pattern, the inverse of the template pattern, is formed on the wafer Wx (patterning). Subsequently, the imprint process for the next shot is performed.

Figure 2:
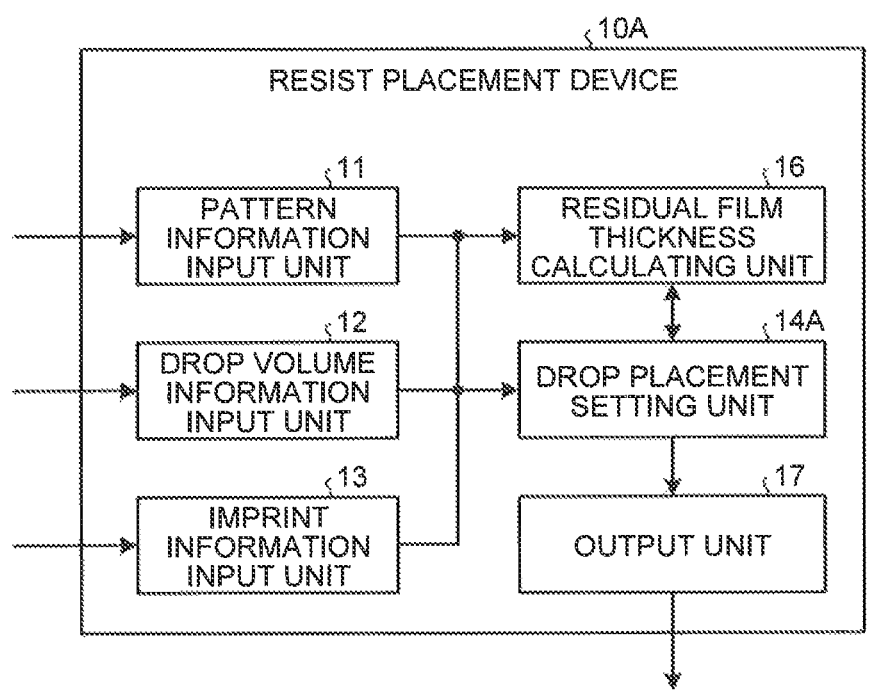
FIG. 2 is a diagram showing the configuration of a resist placement device according to the first embodiment.

FIG. 2 is a diagram showing the configuration of the resist placement device according to the first embodiment. The resist placement device 10A has a pattern information input unit 11, a drop volume information input unit 12, an imprint information input unit 13, a residual film thickness calculating unit 16, a drop placement setting unit 14A, and an output unit 17.

Pattern information about the template pattern is inputted to the pattern information input unit 11. The pattern information input unit 11 sends pattern information to the drop placement setting unit 14A and the residual film thickness calculating unit 16. The pattern information includes information about the template pattern itself. Further, the pattern information may include at least one of the pattern density (coverage rate), pattern size, pattern height (groove depth), pattern perimeter, pattern direction, and total length of the pattern edge projected onto a predetermined direction (e.g., an X or Y direction; of the template pattern.

The information about the template pattern itself is, for example, design data. The template pattern is one shot worth of pattern data and has one or multiple chip areas placed therein. And one or multiple memory-cell areas and a peripheral pattern area are placed in the one chip worth of area.

The drop volume of one drop of resist (resist drop) is inputted to the drop volume information input unit 12. The drop volume information input unit 12 sends the drop volume to the drop placement setting unit 14A and the residual film thickness calculating unit 16.

Process conditions for imprinting and the like are inputted as imprint information to the imprint information input unit 13. The imprint information input unit 13 sends the imprint information to the drop placement setting unit 14A and the residual film thickness calculating unit 16. The imprint, information includes an RLT (Residual Layer Thickness) specified by a user, the size of grids described later, and so on. The RLT is the thickness of the resist film remaining between the template T and the wafer Wx. The imprint information may include at least one of the descending speed of the template T when imprinting, the resist filling time after imprinting, the volatilizing amount distribution oil a resist, and so on.

The drop placement setting unit 14A creates information (resist placement information) about positions at which resist drops are to be placed based on the pattern information, drop volume, and imprint information. The resist placement information includes information (drop grating information) about drop gratings on which to place drops of resist and information (drop position information) about drop positions (coordinates) of resists. The drop grating information includes information such as the positions, size, and shape of drop gratings. The drop placement setting unit 14A sets, for example, the center of each drop grating as a drop positron to set the drop position information.

The drop placement setting unit 14A calculates the number of resist drops to be placed on imprint shots based on, e.g., the drop volume, coverage rate of the template pattern, height of the template pattern, and a specified RLT. Then, the drop placement setting unit 14A creates the drop grating information based on, e.g., the number of drops, the pattern information, and the imprint information.

The drop placement setting unit 14A of the present embodiment sets the drop grating to be one in a parallelogram shape. In this case, the drop placement setting unit 14A sets the drop grating such that each side of the drop grating is not parallel to a side of the grid, (in X and Y directions described later). Note that the drop placement setting unit 14A may set the drop grating such that each side of the drop grating is parallel to a side of the grid. The drop placement setting unit 14A sends the drop position information to the residual film thickness calculating unit 15.

When receiving the result of calculating the RLT from the residual film thickness calculating unit 16, the drop placement setting unit 14A compares this RLT and one RLT specified by a user to calculate the difference. If the difference is not within a predetermined range, the setting unit 14A creates drop grating information in which a new drop grating is set and drop position information. Then, the setting unit 14A sends the drop position information to the calculating unit 16. The setting unit 14A repeats setting a new drop grating and sending the drop position information to the calculating unit 16 until the difference becomes within the predetermined range. When the difference becomes within the predetermined, range, the setting unit 14A sends the drop position information to the output unit 17.

When the drop position information comes in from the setting unit 14A, the residual film thickness calculating unit 16 calculates an RLT based on the drop position information, pattern information, and imprint information. The calculating unit 16 sends the calculated RLT to the setting unit 14A.

The output unit 17 sends the drop position information to the control unit 20. Thus, the control unit 20 controls the process of imprinting onto the wafer Wx using the drop position information. Specifically, the control unit 20 controls the liquid dropping device 28, the sample stage 25A, and the like so as to drop resists onto resist drop positions set in the drop position information.

The output unit 17 may output the drop position information to a coating recipe creating device (not shown). The coating recipe creating device is a device that creates a coating recipe of resist according to instructions from a user. The coating recipe creating device may be placed inside or outside the control unit 20.

Figure 3:
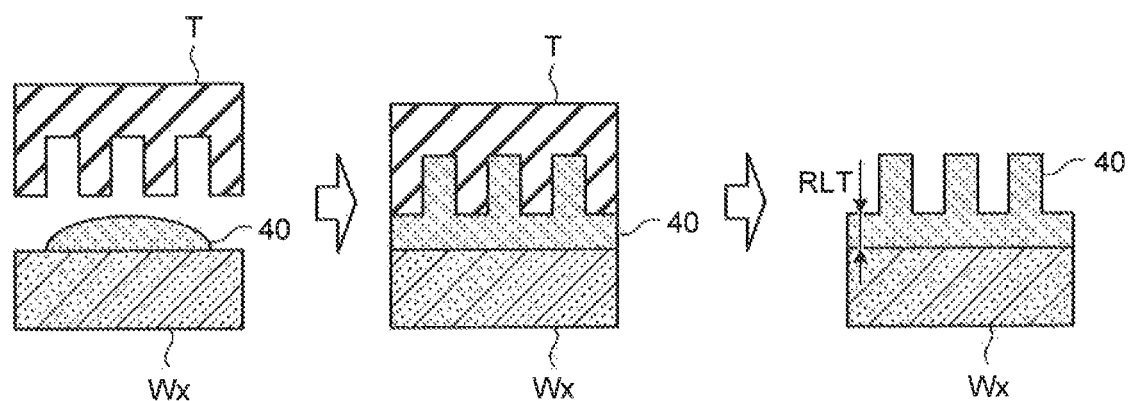
FIG. 3 is a diagram for explaining an RLT.

Here, the RLT will be described. FIG. 3 is a diagram for explaining the RLT. In imprinting, the template T is pressed into a resist 40 cropped onto the wafer Wx. Thus, the resist 40 is filled into the template pattern of the template T.

Then, by irradiating UV light onto the resist 40, the resist 40 is cured. Then, by mold-removing the template T from the cured resist 40, a recess/protrusion pattern of the cured resist 40 is formed on the wafer Wx. The film thickness between the upper surface and the bottom surface at the recess of this recess/protrusion pattern of the resist 40 (film thickness at the recess) is the RLT.

Figure 4:
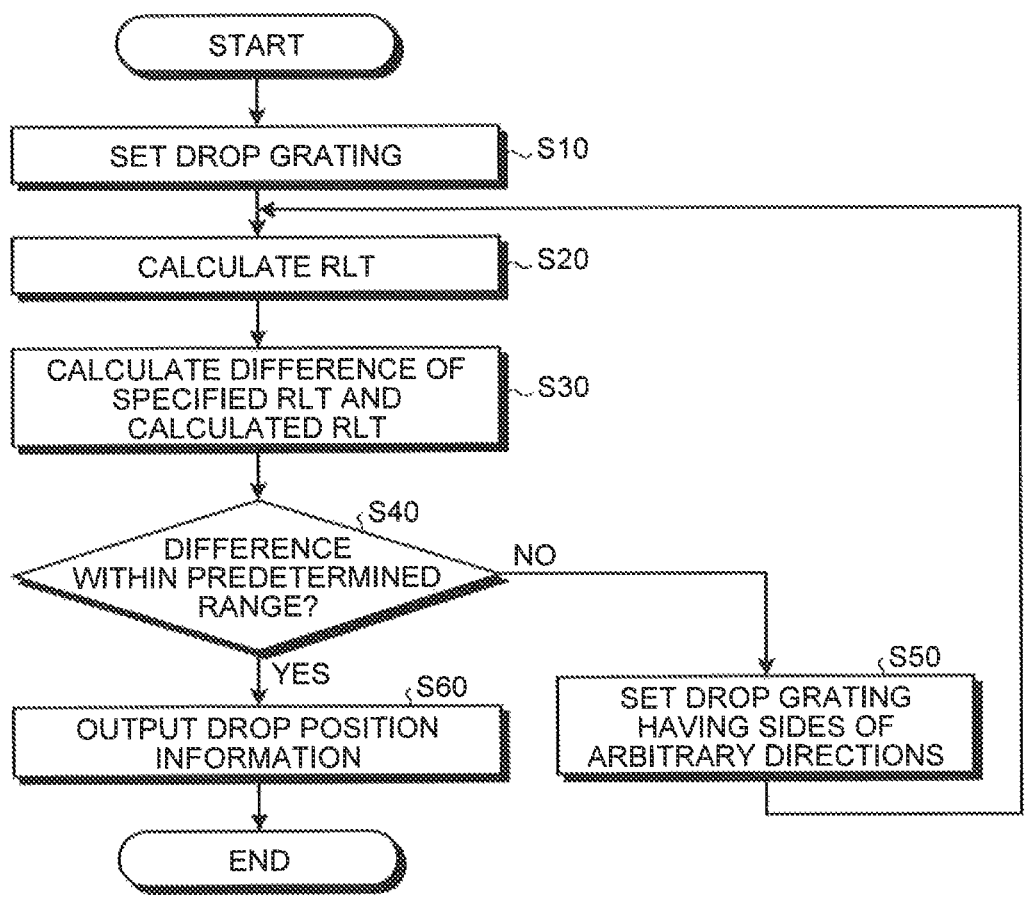
FIG. 4 is a flow chart showing the creation procedure for drop position information in the first-embodiment.

FIG. 4 is a flow chart showing the creation procedure for the drop position information in the first embodiment. The drop placement setting unit 14A creates the resist placement information including the drop grating information and the drop position information based on the pattern information, drop volume, and imprint information. In this case, the drop placement setting unit 14A sets a drop grating at least one side of which is parallel to an X or Y direction (step S10). The setting unit 14A sets the drop grating for periodic arrangement to be in, e.g., a parallelogram shape having two sides parallel to the X direction. Then, the setting unit 14A sets the center of each drop grating as a drop position to set the drop position information. The setting unit 14A sends the drop position information to the calculating unit 16.

The residual film thickness calculating unit 16 calculates an RLT based on the drop position information, pattern information, and imprint information (step S20), The calculating unit 16 sends the calculated RLT to the drop placement setting unit 14A. The setting unit 14A compares the RLT specified by a user and the RLT calculated by the calculating unit 36 to calculate the difference (step S30).

The drop placement setting unit 14A determines whether the difference is within a predetermined range (step S40). If the difference is not within the predetermined range (No at step S40), the setting unit 14A sets a new drop grating. At this time, the setting unit 14A sets a drop grating having sides of arbitrary directions (step S50). The setting unit 14A sets the drop grating for periodic arrangement to have, e.g., sides which are not parallel to the sides of the grid (in X and Y directions described later). Then, the setting unit 14A sets the center of each drop grating as a drop position to set the drop position information. The setting unit 14A sends the drop position information to the calculating unit 16.

Then, the drop placement setting unit 14A and the residual film thickness calculating unit 16 executes the steps S20 and S30 and determines whether the difference is within the predetermined range (step S40). If the difference is not within the predetermined range (No at step S40), the setting unit 14A repeats the steps S50, S20 to S40 until the difference becomes within the predetermined range.

If the difference becomes within the predetermined range (Yes at step S40), the setting unit 14A sends the drop position information to (die output unit 17. The output unit 17 sends the drop position information to the control unit 20 (step S60).

Figure 5:
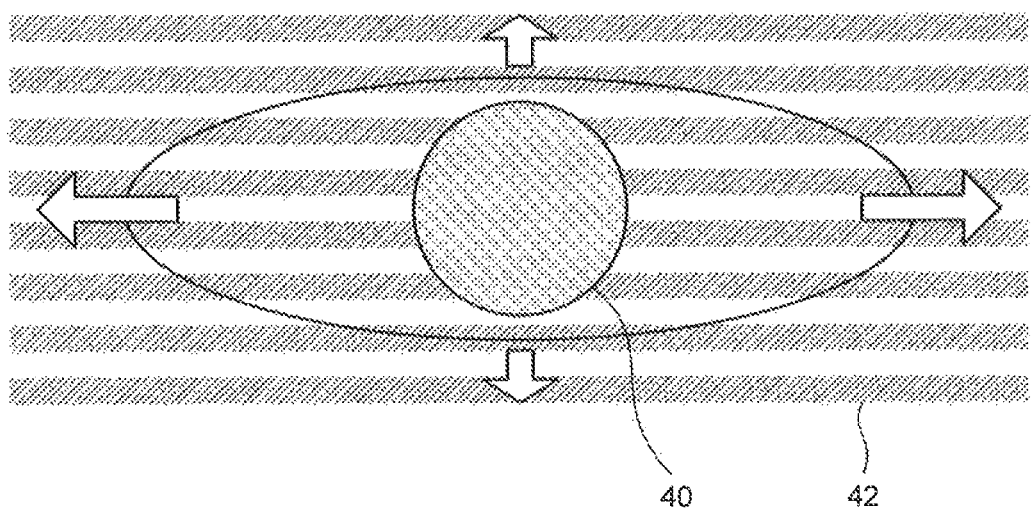
FIG. 5 is a diagram for explaining the relation between the shape of a template pattern and the filling speed of a resist.

Here, the relation between the shape of the template pattern and the filling speed of the resist will be described. FIG. 5 is a diagram for explaining the relation between the shape of the template pattern and the filling speed of the resist. From among template patterns, line-and-space patterns, memory cell arrays, and the like may nave a fine periodic structure. Here, the filling speed of the resist 40 when the template pattern is a line-and-space pattern will be described.

When the resist 40 is filled into the fine periodic structure, the resist is filled at the filling speed according to the shape of the fine periodic structure. For example, the surface tension of the resist 40 is proportional to the surface area of the template pattern. Because the longitudinal direction of a line pattern 42 is larger in surface area than the transverse direction thereof, the surface tension is also larger. Meanwhile, due to the pinning effect, the resist is less likely to spread in the transverse direction of the line pattern 42. As a result, the resist 40 is filled at higher speed in the longitudinal direction of the line pattern 42 than in the transverse direction.

As such, in the fine periodic structure, the resist 40 is filled at the filling speed according to the shape of the fine periodic structure because of the anisotropy of the surface tension. In the case of the fine periodic structure, because the pattern coverage rate is constant, the placement positions of the resists 40 become generatrices for even-space division (tessellation). Accordingly, from the viewpoint of improvement in the filling speed, the area where the fine periodic structure is formed should be divided into parts of a predetermined, shape (such as a polygon). Specifically, the method which places resists on periodic gratings (drop gratings arranged periodically) as shown in FIG. 6 can be thought, of.

Figure 6:
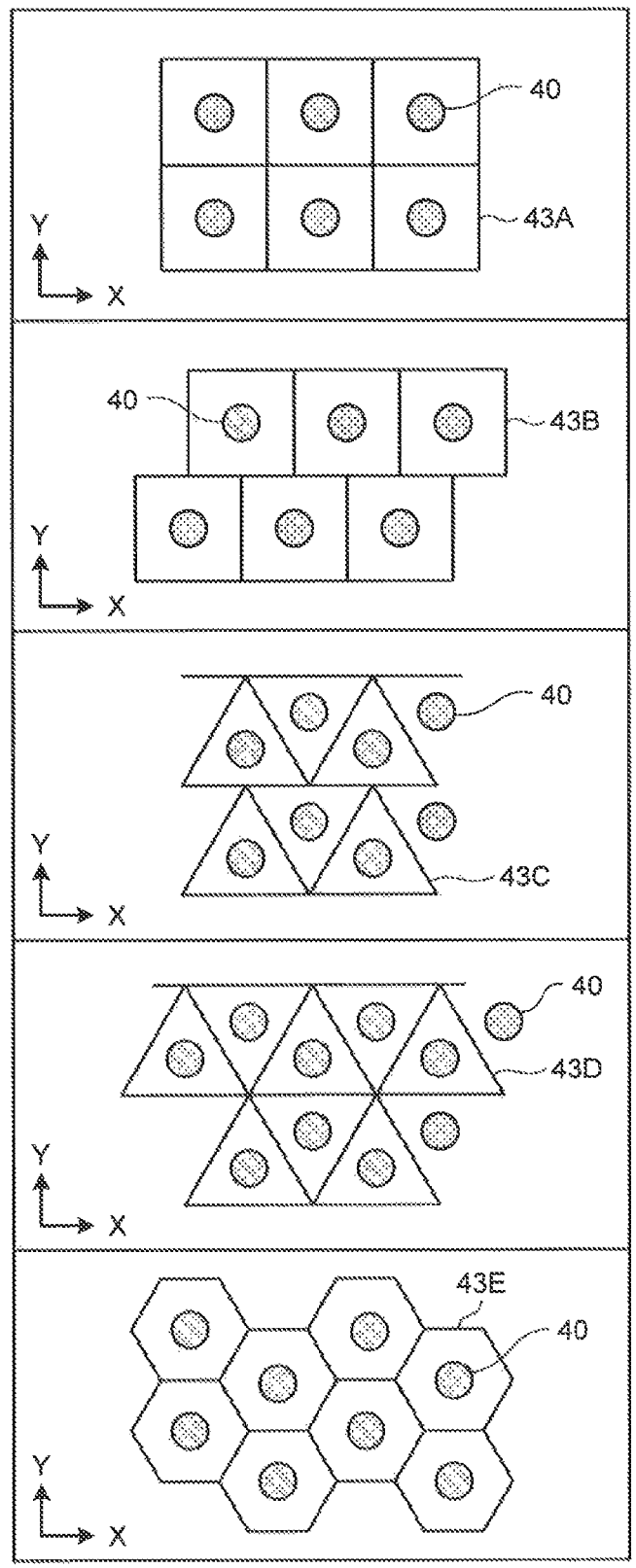
FIG. 6 is a diagram showing examples of resists placed on periodic gratings.

FIG. 6 is a diagram showing examples of resists placed on periodic gratings. Grids formed of positions onto which the liquid dropping device 28 (the ink jet head 8A) can drop resists 40 is configured with sides along the X direction and sides along the Y direction. The sample stage 25A is configured to be movable in the X direction and the Y direction. Also the ink jet head. 8A is configured to be movable in the X direction and the Y direction. Multiple ejection outlets of the resists 40 are provided in the ink jet head. 8A. The ejection outlets are arranged along the X or Y direction.

For example, if the arrangement direction of the ejection outlets is in the X direction, the movement direction of the sample stage 25A is in the Y direction, and if the arrangement direction of the ejection outlets is in the Y direction, the movement direction of the sample stage 25A is in the X direction. The wafer Wx is mounted on the sample stage 25A such that the placement direction of the template pattern (e.g., the longitudinal direction of the line pattern) is along the X or Y direction. For example, cell patterns or the like are arranged in the template regularly along the X direction and the Y direct ion.

Where resists are placed on the periodic gratings, the area onto which to drop the resists 40 is divided into polygons or the like. Then, one drop of resist 40 is placed in each grating. For example, the resists 40 may be arranged such that square drop gratings 43A are arranged parallel to the X direction and the Y direction. Or the resists 40 may be arranged such that square drop gratings 43B are arranged parallel only to the X direction, not to the Y direction.

Or the resists 40 may be arranged such that triangular drop gratings 43C are arranged parallel to the X direction and the Y direction. Or the resists 40 may be arranged such that triangular drop gratings 430 are arranged parallel only to the X direction, not to the Y direction. Or the resists 40 may be arranged such that hexagonal drop gratings 43E are arranged parallel only to the Y direction, not to the X direction.

However, when a resist 40 is placed on a periodic grating, the controllability for the pattern coverage rate and resist height is discrete, and thus if is difficult to make the RLT (Residual Layer Thickness) become within a desired RLT variation range.

FIG. 7 is a diagram showing the relation between the placement position of the resist and the RLT. FIG. 7 snows the results of calculating RLTs in the case where the drop volume is $1.5 \times 10^{-15}$ m$^3$ (1.5 pL), the grid interval at which the ink jet head 8A can drop resists 40 is 720 dpi (about 35. 277 μm), the grid interval is set for the X and Y directions, the template pattern coverage rate is 50%, and the height of the template pattern (groove depth) is 60 nm.

For example, #Grid_X of 1 to 15 indicate that the drop grating interval along the X direction is a 1-grid interval to 15-grid interval respectively. Likewise, #Grid_Y of 1 to 10 indicate that the drop grating interval along the Y direction is a 1-grid interval to 10-grid interval respectively. Thus, the maximum value of the drop grating interval is 15×720 dpi for the X direction and 10×720 dpi for the Y direction. As such, a resist can be placed in a desired drop grating by the liquid dropping device 28 dropping the resist. 40 onto a vertex of a grid.

For example, if the desired RLT is 15 nm, then a drop grating of 3×720 dpi along the X direction and 3×720 dpi along the Y direction (a drop grating of 9×3 grids) should, be set. However, with this drop grating of 9×3 grids as a confer value, the value to which the RLT can be set is 10 nm, 20 nm, or so on, and thus the RLT control by drop placement is ±5 nm. That is, when aiming at an RLT deviating from the RLT of 15 nm, the RLT can only be controlled by units of 5 nm. Hence, the RLT can only be controlled by amounts greater than or equal to 30% of the target RLT. As a result, it was difficult to use resist placement as a control knob for the RLT. Accordingly, in the present embodiment, the drop placement setting unit 14A sets grating vectors of the drop grating to be in directions different from both the X and Y directions.

Figure 8:
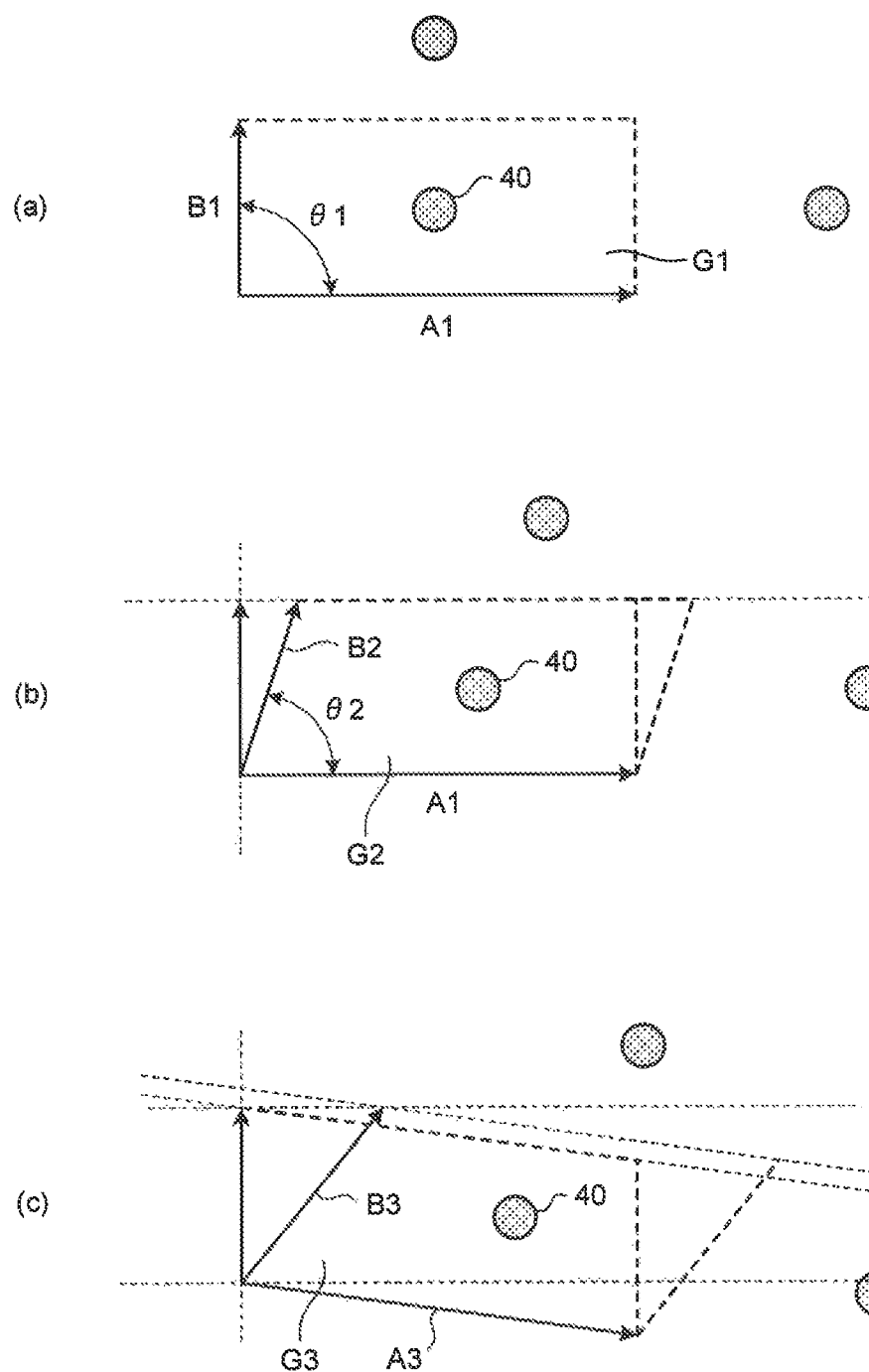
FIGS. 8A-8C are diagrams for explaining the relation between grating vectors and the grating area.

Here, the relation between the grating vectors of the drop grating and the grating area of the drop grating will be described. FIGS. 8A-8C are diagrams for explaining the relation between the grating vectors and the grating area. FIGS. 8A-8C shows grating shapes in which the sides (grating vectors) of a drop grating extend in the X and Y directions or in oblique directions. FIG. 8A shows a rectangular drop grating; FIG. 8B shows a drop grating in a parallelogram shape having sides parallel to the X direction; and FIG. 8G shows a drop grating in a parallelogram shape not having sides parallel to the X direction nor the Y direction.

FIG. 8A shows a drop graining G1 wherein one grating vector of the drop grating is a grating vector A1 of the same direction as the X direction, wherein the other grating vector is a grating vector B1 of the same direction as the Y direction, and wherein the grating vectors A1, B1 intersect at an angle θ1 (=90 degrees).

FIG. 8B shows a drop grating G2 wherein one grating vector of the drop grating is a grating vector A1 of the same direction as the X direction, wherein the other grating vector is a grating vector B2 of a direction different from the Y direction, and wherein the grating vectors A1, B2 intersect at an angle θ2 (other than 90 degrees).

The grating vector B2 is obtained by moving the tip of the grating vector B1 in the same direction as the grating vector A1 (X direction) by n1 grids (n1 is a natural number). In other words, the line joining the tip of the grating vector B2 and the tip of the grating vector B1 is along the X direction. This drop grating G2 has the same grating area as the drop grating G1.

FIG. 8C shows a drop grating G3 wherein one grating vector of the drop grating is a grating vector A3 of a direction different from the X direction and wherein the other grating vector is a grating vector B3 of a direction different from the Y direction.

The grating vector B3 is obtained by moving the tip of the grating vector B1 in the same direction as the grating vector A1 by n2 grids (n2 is a natural number). In other words, the line joining the tip of the grating vector B3 and the tip of the grating vector B1 is along the same direction as the X direction (grating vector A1).

The grating vector A3 is obtained by moving the tip of the grating vector A1 in the same direction as the grating vector B1 (Y direction) by n3 grids (n3 is a natural number). In other words, the line joining the tip of the grating vector A3 and the tip of the grating vector A1 is along the Y direction.

This drop grating G3 in a parallelogram shape has a different grating area than the drop gratings G1, G2. In this way, by adopting vectors (sides) of directions different from the X and Y directions for the grating vectors A3, B3 of the drop grating G3, finer area adjustment can be performed as compared with the case where the grating vectors are in the X and Y directions. Further, by adopting vectors of directions different from the X and Y directions, the resist 40 can be filled at higher speed, thus shortening the imprint time.

The drop placement setting unit 14A may set the grating vectors A3, B3 such that, a first grating length of the grating vector (grating vector A3 in FIG. 8C) corresponding to a smaller one of the angle made by the grating vectors A3, A1 and the angle made by the grating vectors B3, B1 is longer than a second grating length (grating vector B3 in FIG. 8C) corresponding to the larger one.

Figure 9:
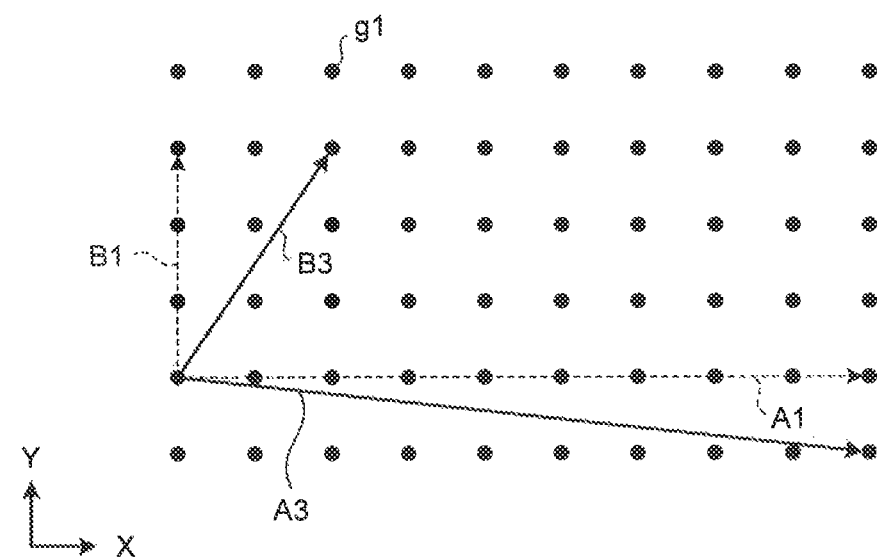
FIG. 9 is a diagram showing the relation between grids onto which to be able to drop a resist and grating vectors.

FIG. 9 is a diagram showing the relation between grids onto which to be able to drop a resist and grating vectors. Grids g1 onto which to be able to drop a resist. 40 are arranged along the X and Y directions at a predetermined period. The grating vectors A1, B1 of the drop grating G1 and the grating vectors A3, B3 of the drop grating G3 mentioned above have start points and end points set on grids g1 respectively.

The grating vector A1 is a vector in the X direction, and the grating vector B1 is a vector in the Y direction. The start point of the grating vector A3 is the same as that of the grating vector A1, and the end point of the grating vector A3 is the same in X coordinate as, and different in Y coordinate from, that of the grating vector A1. The start point of the grating vector B3 is the same as that of the grating vector B1, and the end point of the grating vector B3 is the same in Y coordinate as, and different in X coordinate from, that of the grating vector B1. In other words, the grating vector A3 is the same in X component as, and different in Y component from, the grating vector A1. The grating vector B3 is the same in Y component as, and different in X component from, the grating vector B1.

The drop placement setting unit 14A of the present embodiment sets drop gratings such as the drop gratings G1 to G3 and sets drop positions for resists 40 to be the center positions or the like of the set drop gratings.

Figure 10:
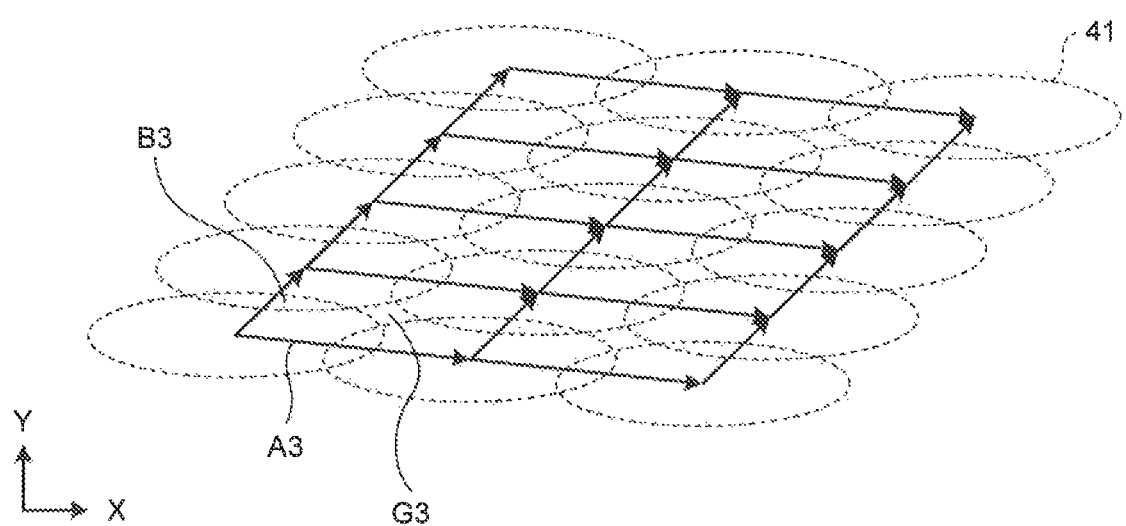
FIG. 10 is a diagram showing an example of drop placement positions set by the resist placement device according to the first embodiment and the way that drops spread.

FIG. 10 is a diagram showing an example of drop placement positions set by the resist placement device according to the first embodiment and the way that drops spread. FIG. 10 shows schematically an example of drop gratings arranged obliquely and the way that resists 40 arranged obliquely spread. As shown in FIG. 10, whereas vectors constituting the grids are in the X and Y directions, the drop gratings G3 are set which have a first axis (grating vector A3) along a direction different from the X direction and a second axis (grating vector B3) along a direction different from, the Y direction.

Then, the center of each drop grating G3 is set as the drop position of a resist 40. When resists 40 are placed on these drop positions, the resists 40 spread to fill areas 41 at the time of imprinting. Subsequently, the resists 40 further spread, so that the entire template pattern is filled with the resist. As such, also when dropped onto drop gratings arranged obliquely, the resists 40 spread, across the template pattern as in the case where resists are dropped, onto rectangular drop gratings.

FIG. 11 is a diagram showing the results of calculating RLTs for set grating vectors. Imprint conditions used when calculating the RLTs shown in FIG. 11 are the same as imprint conditions used when calculating the RLTs shown in FIG. 7. In FIG. 11, grating vectors are represented by A0(ax, ay) and B0(bx, by), where ax is the X component of grating vector A0, ay is the Y component of grating vector A0, bx is the X component of grating vector B0, and by is the Y component of grating vector B0. The grating vector A0 corresponds to the grating vectors A1 to A3, and the grating vector 30 corresponds to the grating vectors B1 to B3.

For example, when A0(ax, ay)=(9, 1) and B0(bx, by)=(0, 3), the RLT is 14.6. When A0(ax, ay)=(9, 1) and B0(bx, by)=(−1, 3), the RLT is 13.0. As such, by skewing both, of two grating vectors forming the drop grating relative to the X and Y directions, the RLT can be controlled by amounts as small as, e.g., 1.6 nm, which could only be controlled by units of 5 nm.

If the desired RLT is 15 nm, the drop placement setting unit 14A sets the drop grating to have A0=(3, 0) and B0=(0, 3), A0=(9, 0) and B0=(1, 3), or A0=(9, 1) and B0=(0, 3).

If the desired RLT is 10 nm, the drop placement setting unit 14A sets the drop grating to have A0=(10, 0) and B0=(0, 3), A0=(10, 0) and B0=(1, 3), or A0=(10, 1) and B0=(0, 3).

Although the present embodiment describes the case where grids on which to be able to drop resists 40 are arranged along the X and Y directions, the sides of the grids may be along directions different from the X and Y directions. For example, by making both the arrangement direction of the ejection outlets provided in the ink jet head 8A and the movement direction of the sample stage 25A be in directions different from the X and Y directions, both sides of the grids can be made to be along directions different from the X and Y directions.

Figure 12:
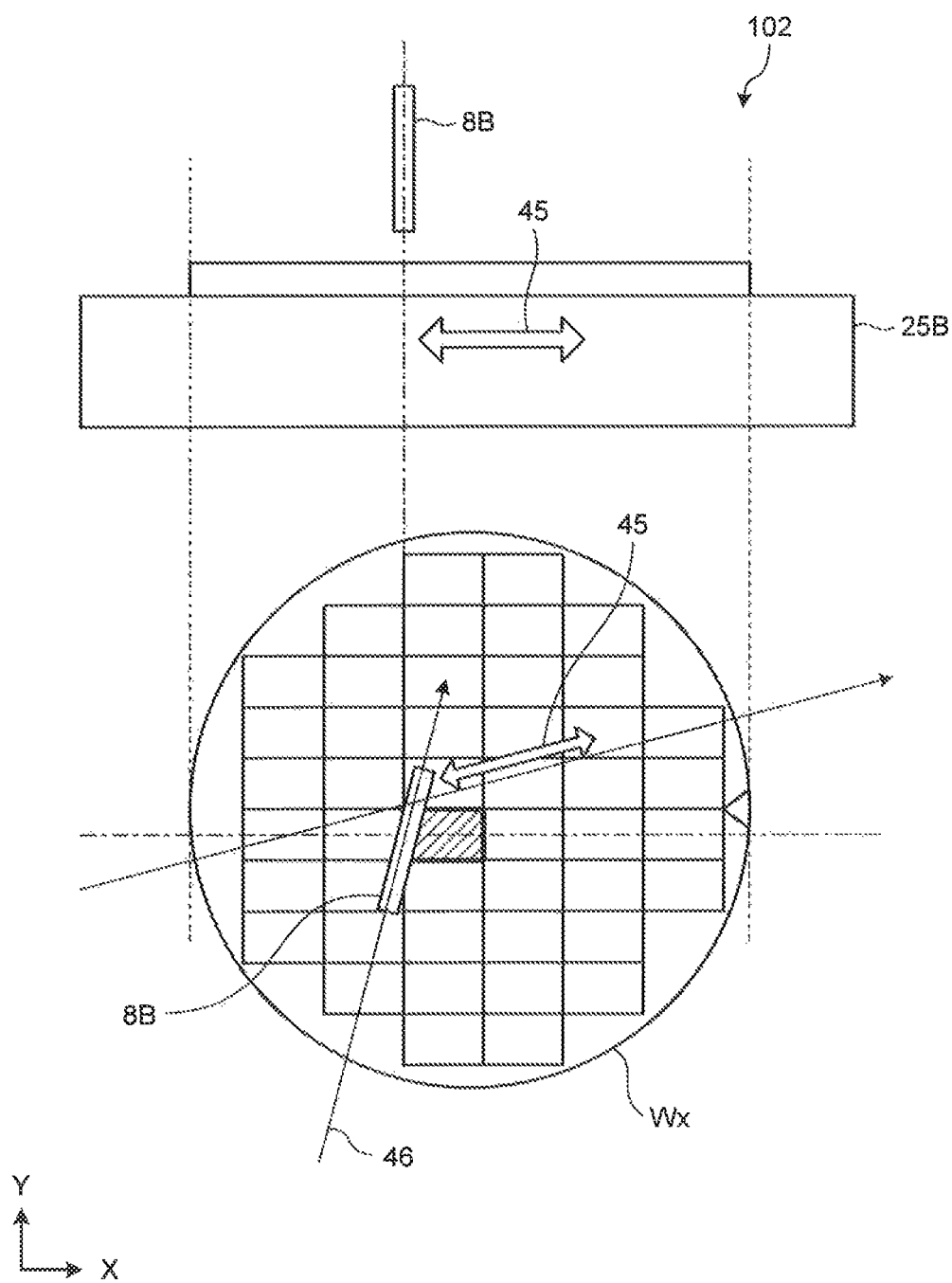
FIG. 12 is a diagram for explaining the configuration, of an imprint apparatus which can make both sides of the grids be along directions different from the X and Y directions.

FIG. 12 is a diagram for explaining the configuration of an imprint apparatus which can make both sides of the grids be along directions different from the X and Y directions. The imprint apparatus 102 comprises a sample stage 25B instead of the sample stage 25A. Further, the imprint apparatus 102 comprises an ink jet head 8B instead of the ink jet head 8A.

In the imprint apparatus 102, the movement direction 45 of the sample stage 25B is in a direction skewed at predetermined angles relative to, e.g., the X and Y directions. Multiple ejection outlets for resists 40 are provided in the ink jet head 8B. These ejection outlets are arranged along a direction (arrangement direction 46) skewed at predetermined angles relative to the X and Y directions. The ink jet head 8B is configured to be movable in directions parallel and perpendicular to the arrangement direction 46 in the XY plane.

As such, in the imprint apparatus 102, both the arrangement direction 46 of ejection outlets of the ink jet head 8B and the movement direction 45 of the sample stage 25B are in directions different from the X and Y directions.

The sample stage 25B is configured such that the movement direction 45 can be changed to be in any direction in the XY plane. Further, the ink jet head 8B is configured such that the arrangement; direction 46 can be changed to be in any direction in the XY plane. By changing the arrangement direction 46, the movement direction of the ink jet head. 8B is also changed.

In the imprint apparatus 102, by changing the movement direction 45 of the sample stage 25B and the arrangement direction 46 of the ink jet head 8B to be in various directions, the drop gratings in various shapes are set. In the imprint apparatus 102, by changing the movement direction 45 and the arrangement direction 46 to be in various directions, the drop gratings formed of, e.g., grating vectors in directions different from the X and Y directions (such as drop grating G3) are set. Thus, the resist placement device 10A can set drop gratings having various areas and hence can easily set an RLT close to a desired RLT.

The setting of resist placement positions by the resist placement device 10A is performed, for example, for each layer in the wafer process or each type of template pattern.

Then, a semiconductor device (semiconductor integrated, circuit) is manufactured using a coating recipe in which resist placement positions are set. Specifically, imprinting onto a wafer Wx is performed using the coating recipe in which resist placement positions are set. After resist patterns are formed on the wafer Wx, etching is performed from above the resist patterns. By this means, actual patterns corresponding to the resist patter us are formed on the wafer Wx. In manufacturing a semiconductor device, the above resist placement setting, imprinting, etching, and so on are repeated for each layer.

According to the first embodiment, by making the sides of drop gratings to be arranged periodically be sides along directions different from grids that the liquid dropping device 28 can set, the controllability of the RLT is improved. Therefore, resist placement having a desired RLT can be performed, and thus transferred patterns of high shape accuracy can be formed by imprint.

Second Embodiment

Next, the second embodiment will be described using FIGS. 13 to 17. In the second embodiment, the imprint pattern area is divided into multiple divided regions, and after provisionally placing resists on, e.g., boundaries between the divided regions, resist placement positions are set.

Figure 13:
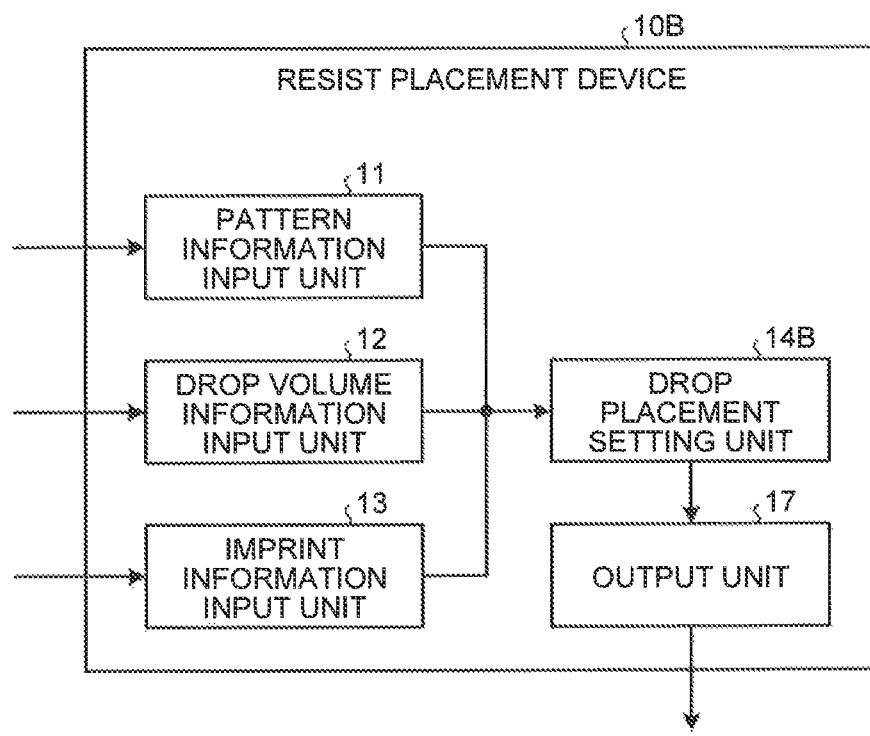
FIG. 13 is a diagram showing the configuration of a resist placement, device according to a second embodiment.

FIG. 13 is a diagram showing one configuration of a resist placement device according to the second embodiment. Of the constituents in FIG. 13, the constituents having the same functions as in the resist placement device 10A of the first embodiment shown in FIG. 2 are denoted by the same reference numerals, with duplicate description thereof being omitted. The resist placement device 10B of the present embodiment is placed in apparatuses like the imprint apparatus 101.

The resist placement device 10B has the pattern information input unit 11, the drop volume information input unit 12, the imprint information input unit 13, a drop placement setting unit 14B, and the output unit 17. The drop placement setting unit 143 divides the imprint pattern area into multiple divided regions and sets resist placement positions for each divided region.

The drop placement setting unit 14B sets resist placement positions for a first divided region. The setting unit 14B calculates the resist volumes of parts spreading into a second divided region of resists placed in drop gratings touching the boundary between the first and second divided regions from among the resists placed on the first divided region. The setting unit 14B sets resist placement positions in the second divided region, regarding resists having the calculated resist volumes as being placed on the boundary.

FIG. 14 is a flow chart showing the procedure of creating the drop position information in the second embodiment. The drop placement setting unit 14B divides the imprint pattern area info multiple divided regions (step S110).

FIG. 15 is a diagram for explaining the process of dividing the imprint pattern area. The imprint pattern area includes regions having various periodic structures and pattern coverage rates. The imprint pattern area includes, for example, a memory cell region 51, a peripheral pattern region 52, and the like of a semiconductor integrated circuit.

The memory cell region 51 and the peripheral pattern region 52 are different in periodic structure and pattern coverage rate. Accordingly, the drop placement setting unit 14B forms, e.g., Voronoi regions with drop placement positions as generatrices and optimizes resist placement positions such that the difference between the requisite amount of resist for each Voronoi region and the drop volume is within a predetermined range (e.g., the difference is zero). In this case, a mismatch, may occur at the boundary between the memory cell region 51 and one peripheral pattern region 52. Accordingly, in the present embodiment, the drop placement setting unit 14B sets resist, placement positions in the peripheral pattern region 52 with resists being provisionally placed, on the boundary between the divided regions.

After setting resist placement positions for a region (the first divided region) demonstrating anisotropic resist-spread quality due to its periodic structure, the drop placement setting unit 14B sets resist placement positions for a region (the second divided region) not demonstrating anisotropic resist-spread quality due to its periodic structure. In the description below, the case of setting resist placement positions for the memory cell region 51 and the peripheral pattern region 52 will be described. Hence, in the process below, the memory cell region 51 is the first divided region, and the peripheral, pattern, region 52 is the second divided region.

The drop placement setting unit 14B sets resist placement positions for the memory cell region 51 after dividing the imprint pattern area into the memory cell region 51 and the peripheral pattern region 52 (step S120).

The drop placement setting unit 14B may set resist placement positions in the memory cell region 51 with any method. The setting unit 14B covers the first divided region with figures (shapes without a concavity) approximating a spread shape, for the memory cell region 51 that is a region demonstrating anisotropic spread quality. The figure approximating the spread shape is for example, a drop grating. Thus, the setting unit 143 covers the memory cell region 51 with, e.g., drop gratings and places a resist in each drop grating. The setting unit 143 sets resist placement positions in the memory cell region 51 using, e.g., the method described in the first embodiment.

Figure 16:
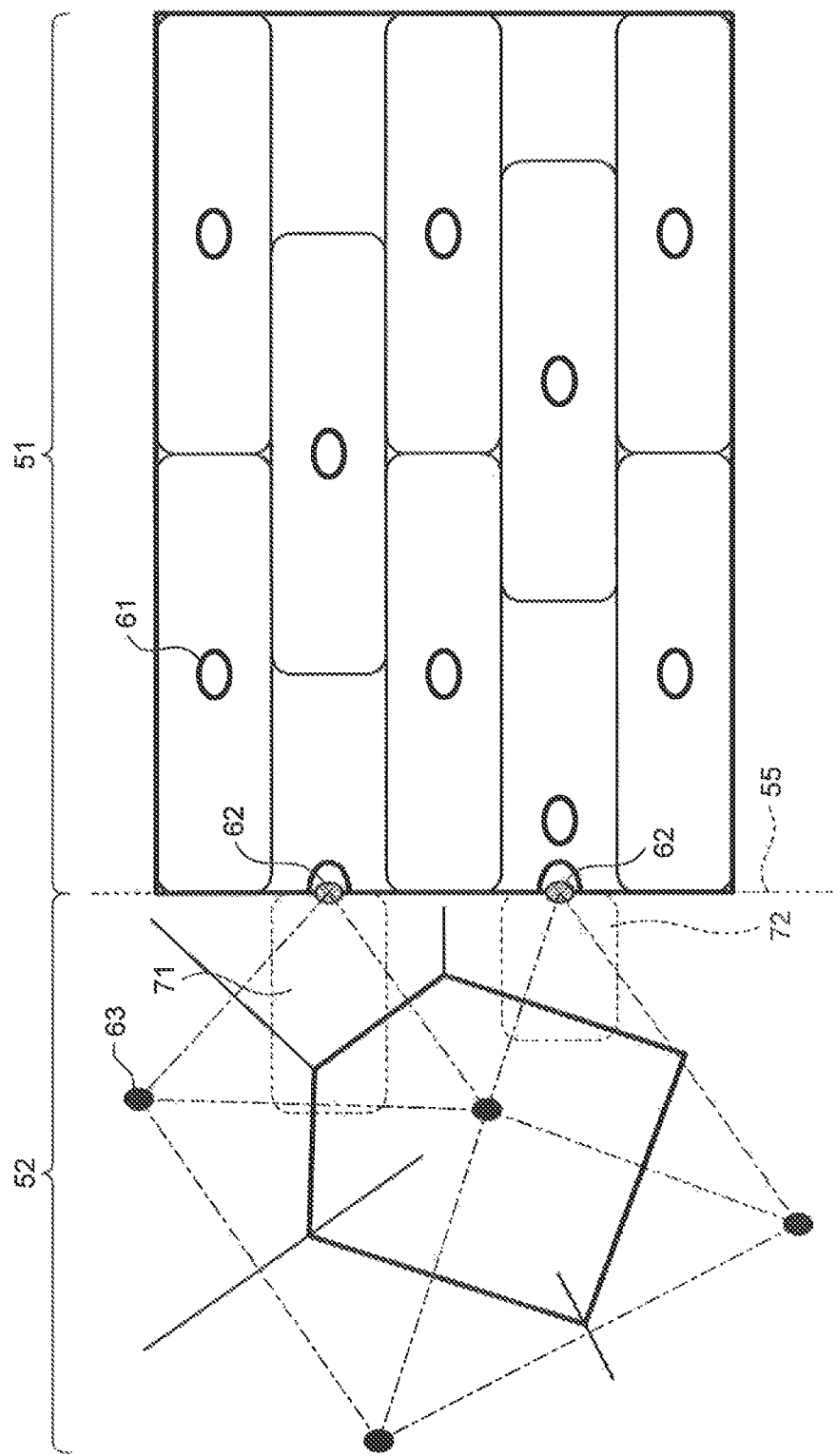
FIG. 16 is a diagram for explaining the process of setting resist placement positions for each divided region.

FIG. 16 is a diagram for explaining the process of setting resist placement positions for each divided region. The drop placement setting unit 14B provisionally places resists 62 on the boundary 55 between the memory cell region 51 and the peripheral pattern region 52 after setting placement positions of resists 61 for the memory cell region 51 (step 3130).

There are places in the boundary 55 where resists 61 jut out from the memory cell region 51. The drop placement setting unit 14B calculates the areas (jutted-over areas 71, 72) of drop gratings over which resists 61 jut out from the memory cell region 51 and the volumes of parts of resists jutting out. The volumes of parts of resists jutting out (jutting-out volumes) are according to the areas of the jutted-over areas 71, 72. The drop placement setting unit 14B calculates the overlap area between a drop grating straddling the boundary 55 and the memory cell region 51 and calculates the volume of part of a resist jutting out based on the difference between the volume of resist necessary for this overlap area and the volume of a drop of resist 61.

The drop placement setting unit 14B sets the volume of resists 62 provisionally to be placed to be the same as the jutting-out volume. The setting unit 14B places a resist (a virtual drop) 62 having the jutting-out volume for the jutted-over area 71 onto a position (e.g., the center) on the overlap (boundary line) between the jutted-over areas 71 and the boundary 55. Likewise, the setting unit 14B places a resist 62 having the jutting-out volume for the jutted-over area 72 onto a position on the overlap (boundary line) between the jutted-over areas 72 and the boundary 55. At this time, the setting unit 14B places the resists 62 to be fixed or movable on the jutted-over areas 71, 72.

Then, the drop placement setting unit 14B sets resist placement positions for the peripheral pattern region 52 (step S140). At this time, the setting unit 14B places resists 63 on the peripheral pattern region 52 assuming that the resists 62 spread to the peripheral pattern region 52 side without spreading to the memory cell region 51 side. In this case, the setting unit 14B may place resists 63 on the peripheral pattern region 52 with any method.

The drop placement setting unit 14B provisionally places resists 63, e.g., for the peripheral pattern region 52. Then, the setting unit 14B forms Voronoi regions with drop placement positions of the resists 63 as generatrices for the peripheral pattern region 52 and moves the resists 63 so that the difference between the requisite amount of resist for each Voronoi region and the drop volume is within a predetermined range. After placing resists 63 in the peripheral pattern region 52, the setting unit 14B eliminates the resists 62 provisionally placed from the imprint pattern, area (step S150). Thus, the setting unit 143 cancels the provisional placement of the resists 62, so that one resists 61, 63 remain in the imprint pattern area.

In this way, the drop placement setting unit 14B sets resist placement positions in the first divided region such as memory cells for which improvement in RLT accuracy and filling speed is required. Thus, the setting unit 14B can obtain the amount of resist jutting out from the boundary 55 (jutting-out volume) and positions thereof (jutted-over areas 71, 72) with accuracy. Thus, the setting unit 14B can set appropriate drop placement positions for the second divided region based on the jutting-out volume and the jutted-over areas 71, 72.

The drop placement setting unit. 14E may place the resists 62 on positions other than on the boundary 55. The setting unit 14R places a resist 62 on a position in, e.g., a drop grating straddling the boundary 55. In this case, the placement position of the resist 62 may be in the memory cell region 51 or in the peripheral pattern region 52 (the jutted-over areas 71, 72).

Next, the hardware configuration of the resist placement devices 10A, 10B will be described. Because the resist, placement devices 10A, 10B have the same hardware configuration, the hardware configuration of the resist placement device 10B will be described.

Figure 17:
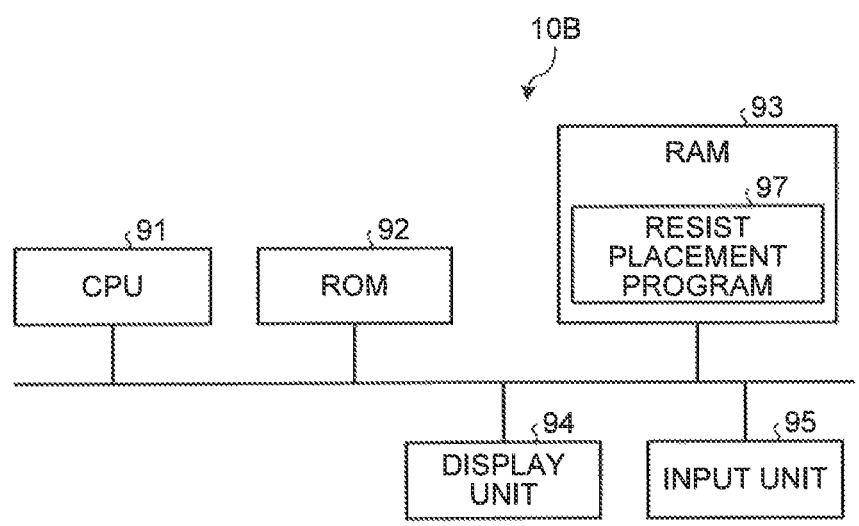
FIG. 17 is a diagram showing the hardware configuration of the resist placement device.

FIG. 17 is a diagram showing the hardware configuration of the resist placement device. The resist placement device 10B has a CPU (Central Processing Unit) 91, a ROM (Read Only Memory) 92, a RAM (Random. Access Memory) 93, a display unit 94, and an input unit 95. In the resist placement device 10B, the CPU 91, ROM 92, RAM 93, display unit 94, and input unit 95 are connected via a bus line.

The CPU 91 performs pattern determination according to a resist placement program 97 that is a computer program. The resist placement program 97 is a computer program product having a nontransitory computer readable medium containing multiple instructions for calculating resist, placement positions, which are executable by a computer. The multiple instructions of the resist placement program 97 have a computer calculate resist placement positions.

The display unit 94 is a display device such as a liquid crystal monitor and displays the pattern information, the drop volume, the imprint information, the resist placement information (drop grating information, drop position information), and the like according to instructions from the CPU 91. The input unit 95 comprises a mouse and a keyboard, and instruction information (parameters and the like necessary for resist placement; entered externally by a user is inputted thereto. The instruction information inputted to the input unit 95 is sent to the CPU 91.

The resist placement program 97 is stored in the ROM 92 and loaded into the BAH 93 via the bus line. BIG. 17 shows the state where the resist placement program 97 is loaded in the RAM 93.

The CPU 91 executes the resist placement program 97 loaded in the RAH 93. Specifically, in the resist placement device 10B, according to instructions entered by a user via the input unit 95, the CPU 91 reads out the resist placement program. 97 from the ROM 92 and spreads it in the program storing area in the RAM 93 to perform various processes. The CPU 91 temporarily stores a variety of data produced in the various processes in the data storing area formed in the RAM 93.

The resist placement program 97 executed in the resist placement device 10B is configured with modules including the drop placement setting unit 14B, and these are loaded onto a main memory and created on the main memory. Note that the resist placement program 97 executed in the resist placement device 10A described in the first embodiment is configured with modules including the residual film thickness calculating unit 16 and the drop placement setting unit 14A.

As described above, according to the second embodiment, the imprint pattern area is divided into multiple divided regions, and after provisionally placing resists on boundaries between the divided regions, resist placement positions are set, and hence appropriate resist placement can be performed also for the boundaries between the divided regions. Thus, transferred patterns of high shape accuracy can be formed by imprint.

As such, according to the first and second embodiments, transferred patterns of high shape accuracy can be formed by imprint.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resist placing method comprising:
    setting, based on information about a grid, first and second grating vectors of a drop grating so that the first and second grating vectors have directions different from both first and second minimum grating vectors of the grid, the grid being a minimum grating unit for which a resist drop is dropped onto a substrate, the drop grating being a grating onto which the resist drop is placed;
    placing the drop grating in accordance with a predetermined rule; and
    placing a plurality of resist drops using the drop grating formed by the set first and second grating vectors,
    wherein the first grating vector is the same in component in a first direction as, and different in component in a second direction perpendicular to the first direction from, the first minimum grating vector, wherein the second grating vector is the same in component in the second direction as, and different in component in the first direction from, the second minimum grating vector, and wherein a first grating length corresponding to a smaller angle from among a first angle made by the first grating vector and the first minimum grating vector and a second angle made by the second grating vector and the second minimum grating vector, is longer than a second grating length corresponding to the larger angle.

2. The resist placing method according to claim 1, wherein the first and second grating vectors are set based on pattern information about a template pattern of the template and a volume of the resist drop.

3. The resist placing method according to claim 2, wherein the pattern information includes at least one of pattern density, pattern size, pattern perimeter, pattern direction, and total length of a pattern edge projected onto a predetermined direction.

4. The resist placing method according to claim 2, wherein the first and second grating vectors are set based further on at least one of a descending speed of the template when imprinting, a filling time after imprinting, and a volatilizing amount distribution of the resist on the substrate.

5. A nontransitory computer readable medium which stores a resist placement program to have a computer calculate placement positions of resist to be used in imprinting, the resist placement program having the computer perform:

setting, based on information about a grid, first and second grating vectors of a drop grating so that the first and second grating vectors have directions different from both first and second minimum grating vectors of the grid, the grid being a minimum grating unit for which a resist drop is dropped onto a substrate, the drop grating being a grating onto which the resist drop is placed;

placing the drop grating in accordance with a predetermined rule; and placing a plurality of resist drops using the drop grating formed by the set first and second grating vectors, wherein the first grating vector is the same in component in a first direction as, and different in component in a second direction perpendicular to the first direction from, the first minimum grating vector, wherein the second grating vector is the same in component in the second direction as, and different in component in the first direction from, the second minimum prating vector, and wherein a first grating length corresponding to a smaller angle from among a first angle made by the first grating vector and the first minimum grating vector and a second angle made by the second grating vector and the second minimum grating vector, is longer than a second grating length corresponding to the larger angle.

6. The nontransitory computer readable medium according to claim 5, wherein the first and second grating vectors are set based on pattern information about a template pattern of the template and a volume of the resist drop.

7. The nontransitory computer readable medium according to claim 6, wherein the pattern information includes at least one of pattern density, pattern size, pattern perimeter, pattern direction, and total length of a pattern edge projected onto a predetermined direction.

8. The nontransitory computer readable medium according to claim 6, wherein the first and second grating vectors are set based further on at least one of a descending speed of the template when imprinting, a filling time after imprinting, and a volatilizing amount distribution of the resist on the substrate.

* * * * *